Sept. 26, 1961 D. J. HAMILTON 3,002,110

TRANSISTOR PULSE GENERATOR

Filed Aug. 12, 1957

INVENTOR,
DOUGLAS J. HAMILTON
BY Gordon R. Sanborn
AGENT

United States Patent Office 3,002,110

Patented Sept. 26, 1961

3,002,110
TRANSISTOR PULSE GENERATOR

Douglas J. Hamilton, Redwood City, Calif., assignor to Hughes Aircraft Company, Culver City, Calif., a corporation of Delaware Filed Aug. 12, 1957, Ser. No. 678,265
9 Claims. (Cl. 307—88.5)

Figures 1, 2, 3:
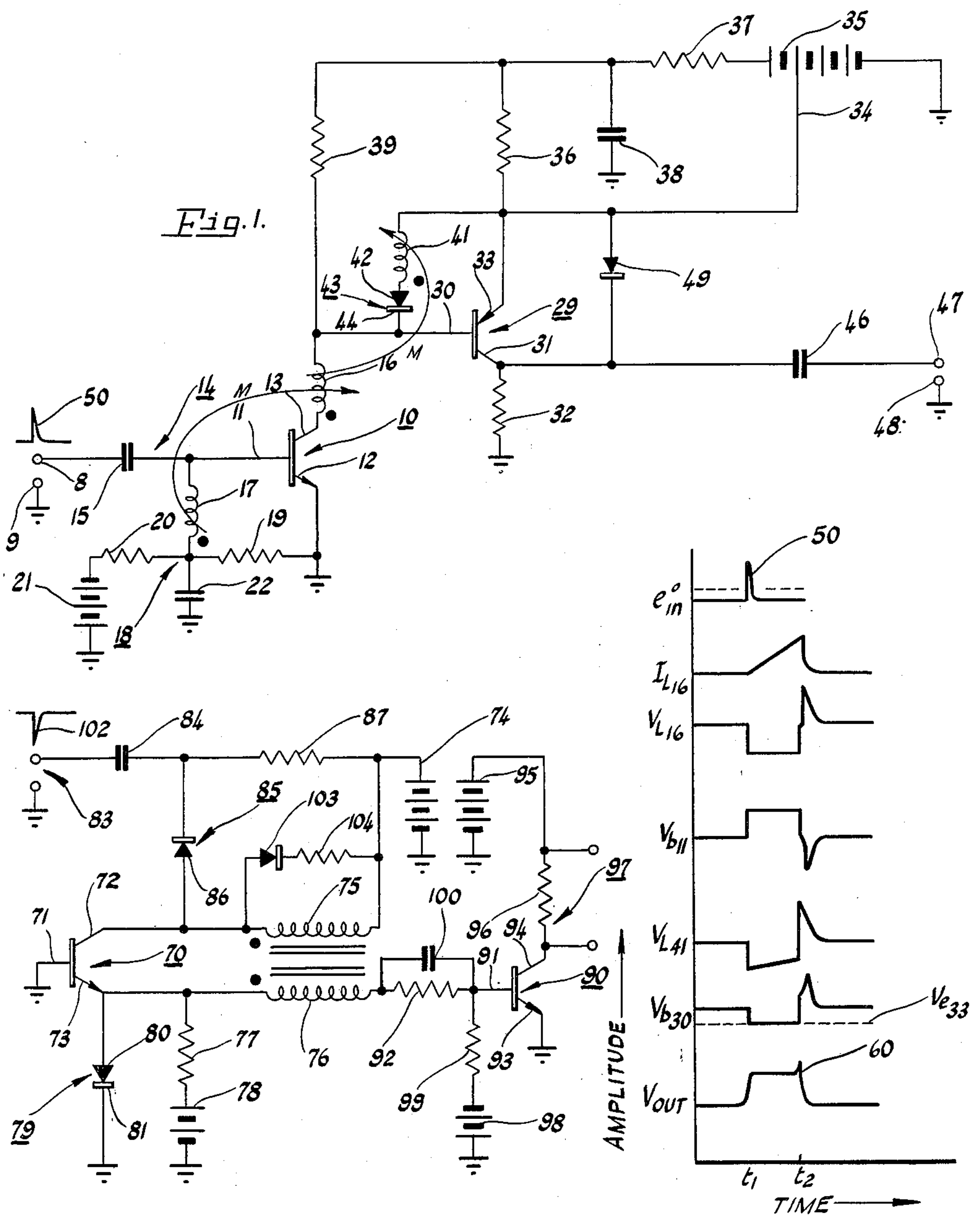

The present invention relates to signal generators and more particularly to a triggered pulse generator using transistors which is adapted to provide an output signal whose time duration is independent of load variations.

Pulse generating circuits of the prior art have the disadvantage that the time duration of the output signal is dependent upon the load to which it is applied. Thus if an output signal of constant time duration is to be supplied to different loads provision must be made to insure that when the impedance of the load changes the time duration of the pulse signal remains constant.

Prior art pulse generating circuits which utilize transistors have a further disadvantage since the time required for the minority carriers in the transistor to be dissipated after the control signal is removed, referred to as the minority carrier storage time, adds to the time duration of the output signal and may in fact be as long as the desired time duration of the output pulse.

It is therefore an object of the present invention to provide a pulse generator which supplies an output signal of constant time duration even when the load to which the pulse is applied is not constant.

Another object of the present invention is to provide a pulse generator using transistors and which is adapted to supply an output signal of constant time duration to a load element which may vary, and in which the minority carrier storage time of the transistors is materially reduced.

In accordance with the present invention a first transistor of one conductivity type is adapted to have its state of conduction changed upon the application of an input signal such as a clock pulse as is used in electronic digital computers. A second transistor which may be of the opposite conductivity type to that of the first transistor is coupled with the first transistor in a manner such that a change of the state of conduction of the first transistor causes a corresponding change in the state of conduction of the second transistor. The second transistor is adapted to provide an output signal. A pair of inductors in energy exchange relationship are connected respectively in the emitter-collector and the base-emitter circuits (or both in the collector-emitter circuit) of the first transistor in a manner such that regeneration results when a clock pulse is applied to the first transistor. This provides the first transistor with a selectively variable repetition rate. Thus the first transistor serves as a blocking oscillator or signal generator to control the second transistor.

A network which includes a third inductor, or in some cases the second inductor, serially connected with a diode is placed in parallel with the emitter-base circuit of the second transistor so that when the first transistor is being rendered nonconductive a relatively large signal of the proper polarity is applied to the emitter-base circuit of the second transistor. In this manner the minority carrier storage time of the second transistor is materially reduced and its effect upon the output signal is decreased. If a third inductor is used, it is magnetically coupled to, or is in energy exchange relationship with, the first inductor and derives the energy required for the turn-off signal of the second transistor from the first inductor.

The load element to which the output signal is supplied is placed in the emitter-collector circuit of the second transistor, and the emitter-base circuit of the second transistor forms part of the load upon the first transistor. Thus the small variation of base input impedance of the second transistor with large variations of its collector load is utilized to provide a circuit which supplies an output signal whose time duration is primarily dependent upon the quasi-stable time period of the first transistor.

These and other objects of the present invention are more clearly defined in the appended claims. The invention itself, however, both as to its organization and method of operation as well as additional advantages and objects thereof will be more clearly understood from the following description when read in conjunction with the accompanying drawing and in which, FIG. 1 is a schematic circuit diagram of one embodiment of the pulse generator of the present invention;

FIG. 2 is a graph of time versus amplitude for various voltages and currents of the circuit of FIG. 1; and FIG. 3 is a circuit diagram of another embodiment of the present invention.

Referring now to the drawing and in particular to FIG. 1, a pair of signal input terminals 8 and 9 is adapted to receive control signals from a suitable pulse source. A first transistor is shown for purpose of illustration as an NPN junction transistor 10 having a base electrode 11, an emitter electrode 12, and a collector electrode 13, and is adapted to receive input signals from a signal input circuit 14 which may include a signal coupling capacitor 15 connected between the base electrode 11 and the signal input terminal 8. A first inductor 16 is connected in series with the emitter-collector circuit of the first transistor 10 and is shown for purpose of illustration as being connected to the collector electrode 13. A second inductor 17 is connected between the base electrode 11 and a point of reference potential provided by a voltage divider network 18 which includes a pair of serially connected resistors 19 and 20 supplied with current by a first source of direct current (D.C.) potential such as the battery 21 having its positive terminal connected to a point of reference potential referred to as ground and its negative terminal connected to one end of the resistor 20. One end of the resistor 19 is grounded and is also connected to the emitter electrode 12. A filter capacitor 22 is connected between the junction point of the resistors 19, 20 and ground.

The current flow through the resistors 19 and 20 provided by the first battery 21 serves to maintain the junction point of the resistors 19 and 20 at a D.C. potential which is negative with respect to the potential of the grounded emitter 12. Since the second inductor 17 is connected between this junction point and the base electrode 11, the base 11 is normally negative with respect to the emitter 12 and the first transistor 10 is normally nonconductive.

A second transistor is shown for purposes of illustration as a PNP junction transistor 29 having a base electrode 30 coupled to the collector electrode 13 of the first transistor through the first inductor 16, a collector electrode 31 coupled to ground through a load element shown for purpose of illustration as a resistor 32, and an emitter electrode 33 connected to an intermediate tap 34 of a second battery 35 which has its negative terminal grounded. The emitter electrode 33 is also coupled to the positive terminal of the battery 35 through a voltage divider network including a pair of serially connected resistors 36 and 37, with the junction point of the resistors 36 and 37 being grounded through a second filter capacitor 38. The base electrode 30 is coupled to the junction point of the resistors 36 and 37 through a resistor 39 and is thereby maintained at a potential which is normally positive with respect to the emitter potential when the first transistor is nonconductive. That is, the current flow through the voltage divider network from the positive terminal of the battery 35 through the resistors 37 and 36 to the tap 34 serves to maintain the junction point of the resistors 37 and 36 positive with respect to the intermediate tap 34 of the battery 35, and thereby maintain the second transistor 29 normally nonconductive.

A third inductor 41 is connected between the emitter 33 and the anode 42 of a diode 43 which has its cathode 44 connected to the base electrode 30. From the conditions above set forth it is seen that the diode 43 is normally backwardly biased and therefore nonconductive.

The second and third inductors 17 and 41 are in energy exchange relationship with the first inductor 16, and therefore the three inductors form a transformer with three windings. The energy exchange relationship of the inductors 17, 16 and 41 is illustrated by a coupling arrow between the inductors 17 and 16 and the inductors 41 and 16, each arrow being designated by an M to indicate mutual coupling. To illustrate the phase relationship of the associated voltages which will be induced in the windings a dot is placed at one end of each of the inductors. Thus a negative going signal at the collector end of the first inductor or winding 16 will cause a negative going signal to be applied to the anode 42 of the diode 43 and a positive going signal to be applied to the base 11 of the first transistor. Therefore regenerative feedback is provided between the base and collector-emitter circuit of the first transistor and the first transistor behaves as a blocking oscillator.

A signal output capacitor 46 may be connected between the collector electrode 31 of the signal output transistor 29 and a first signal output terminal 47. A second signal output terminal 48 is grounded. A second diode 49 may be connected in parallel with the emitter-collector circuit of the transistor 29, with its anode connected to the emitter 33 and its cathode connected to the collector 31. The diode 49 serves to limit the amplitude of the output signal, as will be explained later.

To aid in the description of the operation of the pulse generator shown in FIG. 1, reference will now be made to FIG. 2 wherein the amplitude of various voltages and currents existing in the circuit of FIG. 1 are shown as functions of time.

From the above set forth conditions, the two transistors 10 and 29 are seen to be normally nonconductive. When positive going input signal 50 is applied through the signal coupling capacitor 15 to the base 11 of the first transistor 10, the first transistor is rendered conductive and thereafter behaves as a blocking oscillator. Collector-emitter current begins to flow in the first transistor, and thus a current indicated in FIG. 2 by $I_{L16}$ flows through the first inductor 16 and a voltage $V_{L16}$ associated therewith arises across the first inductor 16. The collector end of the first inductor 16 therefore becomes negative with respect to the quiescent level at which it was maintained prior to conduction of the first transistor. Associated with the current flow $I_{L16}$ and the negative change of potential $V_{L16}$ at the collector end of the first inductor 16 is a voltage across the second inductor 17 which is of a polarity to cause the potential of the base electrode 11 to become more positive. This is indicated by the positive going portion of the voltage waveform labeled $V_{b11}$. Associated with the rise in base potential of the first transistor 10 is a current flow from the base to the emitter, which is supplied as a result of the transformer action between the first inductor 16 and the second inductor 17. Therefore as the current flow through the first inductor 16 tends to increase, current is supplied to the base electrode, and a regenerative action takes place with the first transistor 10 remaining conductive as long as the change of current flow through the first inductor 16 is capable of supporting the required base-emitter current.

The change of current flow through the first inductor 16 also gives rise to a voltage across the third inductor 41 which is indicated by the voltage waveform $V_{L41}$. Since the first and third inductors 16 and 41 are so coupled that a negative going change of potential is applied to the anode 42 of the diode 43, the diode remains backwardly biased.

The collector-emitter current flow of the first transistor 10 is supplied by the battery 35 through the resistors 37 and 39. When sufficient current flows through the resistor 39 to cause the potential of the base electrode 30 of the second transistor to become equal to the potential of the emitter 33, as indicated by the voltage waveform labeled $V_{b30}$ which is referenced to the potential of the emitter 33 ($V_{e33}$), the second transistor 29 is rendered conductive. As the second transistor 29 becomes conductive an output signal is provided between the signal output terminals 47 and 48. This is indicated by the voltage waveform $V_{out}$. If the second transistor is rendered highly conductive it becomes saturated and the amplitude of the output signal remains substantially constant.

When the second transistor has been rendered conductive the impedance of its emitter-base circuit is relatively small in comparison to the resistance of the resistor 39. Therefore as the current through the inductor 16 increases the additional current is supplied through the emitter-base circuit of the second transistor. The potential drop across the emitter-base junction is very small and hence the diode 43 remains nonconductive.

At a time $t_2$ when the change of current through inductor 16 is no longer able to induce sufficient current for the base 11 of the first transistor through the second inductor 17, the base-emitter junction becomes backwardly biased and the first transistor is rendered nonconductive. The collector-emitter current flow of the first transistor stops and the potential $V_{L16}$ across the first inductor 16 changes polarity and then decays to zero as the current $I_{L16}$ falls to zero. This induces a negative voltage at the base 11 through the second inductor 17 and thereby insures rapid turn-off of the first transistor.

Associated with the reduction of current flow through the inductor 16 is a voltage across the third inductor 41. As the field associated with the current flow $I_{L16}$ through the inductor 16 begins to collapse a positive signal is applied to the anode 42 of the diode 43, rendering the diode conductive. This positive signal is thus applied to the base 30 of the second transistor 29 and serves to insure a rapid turn-off of the second transistor. That is, as the electromagnetic field associated with the first inductor 16 collapses, a reverse base current larger than the forward base current by a factor determined by the number of turns in the inductor 41 with respect to the number of turns in inductor 16 is supplied to the transistor 29. Therefore the minority carrier storage time of the second transistor is materially reduced as a result of the large reverse current. If the emitter junction recovers more rapidly than the collector junction, the potential of the collector 31 will follow the potential of the base 30. This would occur, for example, when the load current is approximately equal to, or less than, the reverse base current. Hence a positive spike 60 may tend to appear in the output signal $V_{out}$. It is for the purpose of limiting the amplitude of the spike 60 that the second diode 49 is included in the circuit.

To further illustrate the teachings of the present invention another pulse generator constructed in accordance with the present invention is shown in FIG. 3. A first transistor shown for purpose of illustration as an NPN junction transistor 70 having a grounded base electrode 71, a collector electrode 72, and an emitter electrode 73 is adapted to serve as a blocking oscillator. To this end the collector 72 is coupled to the positive terminal of a first battery 74 through a first inductor 75 and the emitter electrode 73 is connected to a second inductor 76 which is placed in energy exchange relationship with the first inductor 75. The phase relationship of the two inductors is such that regenerative feedback is provided.

The emitter electrode 73 is coupled through a dropping resistor 77 to the positive terminal of a second battery 78 and is also coupled to ground through a first diode 79 having its anode 80 connected to the emitter 73 and its cathode 81 grounded. Current flow from the battery 78 through the dropping resistor 77 and the diode 79 serves to maintain the emitter electrode 73 slightly positive with respect to the grounded base electrode 71 due to the voltage drop across the diode 79. Hence the first transistor 70 is normally nonconductive.

A signal input circuit which includes a pair of signal input terminals 83 is adapted to convey negative pulse signals to the collector of the first transistor and thereby trigger the blocking oscillator. Thus one of the signal input terminals 83 is grounded and the other is coupled to the collector 72 through a signal input capacitor 84 and a second diode 85 which has its anode 86 connected directly to the collector 72. To reference any input signals to the potential at which the collector 72 is normally maintained when the first transistor is nonconductive, an impedance element such as a resistor 87 is connected between the positive terminal of the battery 74 and the capacitor 84.

A second transistor shown for purpose of illustration as an NPN junction transistor 90 having a base electrode 91 coupled to the second inductor 76 through an impedance element such as a resistor 92, a grounded emitter electrode 93, and a collector electrode 94 coupled to the positive terminal of a third battery 95 through a load element shown for purpose of illustration as a resistor 96, is adapted to provide an output signal between a pair of signal output terminals 97 connected across the load element 96. To bias the second transistor in a normally nonconductive state the base electrode 91 is coupled to the negative terminal of a fourth battery 98 through a dropping resistor 99. The current flow from the battery 78 through the resistors 77, 92, and 99 is adjusted to a value such that the base of the second transistor is slightly negative with respect to the grounded emitter 93 and therefore the second transistor is normally nonconductive. To enhance the rise time of the output signals from the circuit of FIG. 3, a cross coupling capacitor 100 may be connected in parallel with resistor 92 between the base 91 and the second inductor 76.

When a signal such as a negative clock pulse 102 is applied between the pair of signal input terminals 83, the diode 85 is rendered conductive and the collector end of the first inductor 75 begins to drop in potiential. That is, the collector 72 becomes more negative. This induces a negative potential in the emitter end of the second inductor 76 and a positive voltage in the end of the second inductor 76 which is coupled with the base 91 of the second transistor. This renders the second transistor conductive. When the second transistor is rendered conductive, its base current increases. Thus current flows from the battery 78 through the second inductor 76 and the resistor 92 into the base 91. As this base current increases and as the induced voltage across the second inductor 76 increases the first diode 79 becomes backwardly biased and the potential of the emitter 73 drops below ground. Accordingly, the first transistor 70 is rendered conductive. The current flow through the first transistor then increases due to the regenerative feedback between the two inductors. The increased current flow through the first inductor 75 renders the diode 85 nonconductive and therefore essentially disconnects the signal input source from the collector 72.

It is thus seen that after the first transistor 70 is rendered conductive the first diode 79 is backwardly biased and therefore the load for the first transistor is essentially the resistor 92 and the base-emitter junction of the second transistor. Hence the first transistor goes into saturation.

When the collector circuit of the first transistor can no longer provide the necesesary current to continue the regenerative feedback, the first transistor leaves its saturated condition and regenerates to a nonconductive state. Thus the voltages associated with the inductors 75 and 76 reverse, with the end of the second inductor 76 which is connected to the emitter 73 attempting to go positive. The end connected to the emitter 73 is immediately clamped to ground potential by the diode 79, and therefore the entire voltage across the second inductor 76 is effectively a potential between ground and some negative value. Hence the base 91 of the second transistor becomes negative with respect to ground and the second transistor 90 is in turn rendered nonconductive.

As the field associated with the current flow through the inductors begins to collapse as a result of the first transistor being rendered nonconductive, a large reverse base current is provided for the second transistor. That is, the energy associated with the first inductor 75 is dissipated in a current flow through the diode 79, which provides reverse current for the base 91. Therefore the minority carrier storage time of the second transistor is greatly reduced in a manner analogous to that described in conjunction with the circuit of FIG. 1.

Since all of the energy associated with the inductors may not be dissipated when the two transistors are rendered nonconductive a third diode 103 and a damping resistor 104 may be connected in parallel with the first inductor 75 to prevent oscillation or ringing of the circuit.

Since in the circuits of both FIGS. 1 and 3 the relatively large positive going signal applied to the base of the second transistor when the first transistor is rendered nonconductive reduces the minority carrier storage time of the second transistor and hence its turn-off time, the time duration of the output signal is determined essentially by the quasi-stable time period of the first transistor. The base input impedance of a saturated transistor remains substantially constant with variations in the collector load, and since the load for the first transistor includes the base impedance of the second transistor, the load upon the first transistor remains essentially constant with variations in the collector load of the second transistor. Therefore the quasi-stable time period of the first transistor remains nearly constant for various loads upon the second transistor. Hence the quasi-stable time period of the first transistor may be readily controlled through the proper selection of circuit parameters, and thus the time duration of the output signal can be controlled. For any set of circuit parameters the time duration of the output signal will remain substantially constant for loads of various impedances.

Although it is to be expressly understood that the values of the various components of the pulse generator of the present invention may be varied for any desired purpose the following circuit specifications for the circuit shown in FIG. 1 are included by way of example.

| | |
|---|---|
| Transistor **10** | Sylvania type 2N94A. |
| Transistor **29** | General Electric type 2N137. |
| Inductor **16** | 20 turns. |
| Inductor **17** | 10 turns. |
| Inductor **41** | 20 turns. |
| Resistor **37** | 1000 ohms. |
| Resistor **39** | 750 ohms. |
| Resistor **36** | 100 ohms. |
| Resistor **20** | 2000 ohms. |
| Resistor **19** | 200 ohms. |
| Voltage source **21** | −10 volts. |
| Voltage source **35** | +20 volts. |
| Tap **34** | +10 volts. |

The pulse generator constructed in accordance with the above set forth circuit specifications was utilized to provide an output pulse having a time width of eight and one half microseconds of which one half microsecond was due to minority carrier storage time. The output pulse width remained essentially unchanged for load variations from 51 ohms to 2700 ohms. It was found that if the third inductor 41 was not included in the circuit, the storage time was increased by at least a factor of 10.

There has thus been described a pulse generator adapted to provide an output pulse of constant time duration in response to a clock pulse signal with the width of the output pulse being essentially unchanged by variations in the load element to which the pulse signal is provided. In addition, the pulse generator of the present invention includes means for decreasing the effect of the minority carrier storage time of a transistor upon an output signal.

What is claimed is:

1. A pulse generator comprising in combination, a first transistor of one conductivity type having base, collector, and emitter electrodes, a second transistor of another conductivity type having base, collector and emitter electrodes, first, second, and third inductors electromagnetically coupled, said first inductor being connected between the base and emitter electrodes of said first transistor, said second inductor being directly connected between the base electrode of said second transistor and the collector electrode of said first transistor, a diode, said third inductor and said diode being connected in series between the emitter and base electrodes of said second transistor, bias means for rendering said first and said second transistors normally nonconductive, a control circuit coupled with the base of said first transistor, and a load circuit coupled with the collector of said second transistor.

2. A pulse generator comprising in combination, a first NPN transistor, a second PNP transistor, each of said transistors having base, collector, and emitter electrodes, bias means coupled with each of said transistors for rendering each normally nonconductive, a transformer having first, second and third windings, said first winding being directly connected between the collector electrode of said first transistor and the base electrode of said second transistor, said second winding being connected to the base electrode of said first transistor and adapted to apply regenerative signal energy thereto, a diode having a cathode connected with the base electrode of said second transistor, said third winding and said diode being connected in series directly to the emitter electrode of said second transistor, a signal input circuit coupled with the base electrode of said first transistor, and a signal output circuit coupled with the collector electrode of said second transistor.

3. A pulse generating circuit comprising first transistor having a control circuit and a load circuit including an emitter and a collector, a first inductor having a first end connected to the collector in said load circuit, a regenerative signal feedback network connected between said first inductor and said control circuit, a second transistor having a base electrode directly connected to a second end of said first inductor, said second transistor having an emitter-collector circuit, a second inductor coupled in energy exchange relationship with said first inductor, and a diode connected in series with said second inductor, said base electrode and a potential source to provide a discharge path for energy associated with said inductors, and thereupon apply a reverse base current to said second transistor.

4. A pulse generator for supplying an output signal of substantially constant time duration to a variable load comprising a source of input signals of relatively short time duration compared to the output signal, a first transistor having a control electrode and a load circuit including a collector electrode and an emitter electrode, said control electrode coupled to said source of input signals for being biased into conduction, a regenerative signal feedback circuit connected between said load circuit and said control electrode, said regenerative feedback circuit including a first inductor having one end connected to the collector of said first transistor for responding regeneratively to load current to control the conduction of said first transistor, a second transistor having base collector and emitter electrodes, said base electrode being connected to the other end of said first inductor, a second inductor coupled with said first inductor, a diode connected to said second inductor, said diode and said second inductor being connected in series with the base electrode and emitter electrode of said second transistor for providing a reverse base current for said second transistor.

5. A pulse generator for providing an output signal of substantially constant time duration to a varying load comprising input means to provide input signals of relatively short time duration compared to the time duration of the output signal, a first transistor having a control electrode coupled to said input means and having emitter and collector electrodes, a control circuit coupled to said base electrode, a load circuit including the emitter and collector electrodes of said first transistor, said load circuit including a first inductor with a first end coupled to the collector of said first transistor, said first inductor being coupled to said control circuit to provide regenerative signal feedback to said control circuit, a second transistor having base, emitter and collector electrodes, the base of said second transistor being connected directly to the second end of said first inductor, a second inductor in energy exchange relationship with said first inductor, a unilateral current conductive device connected to said second inductor, said device and said second inductor being connected in series between the base and emitter electrodes of said second transistor.

6. A pulse generator comprising first and second transistors each having base, collector and emitter electrodes, a source of potential, a first inductor having a first end coupled to the collector of said first transistor and having a second end coupled to said source of potential and to said base electrode of said second transistor, a signal feedback network coupled between said first inductor and the base electrode of said first transistor for applying regenerative feedback signal energy to the base electrode of said first transistor, a second inductor in energy exchange relationship with said first inductor, and a diode coupled to said second inductor, said second inductor and said diode being coupled in series between the base and emitter electrodes of said second transistor.

7. A pulse generator comprising first, second and third sources of potential, a first transistor having a base electrode, an emitter electrode and a collector electrode, said emitter electrode coupled to said first source of potential, a first inductor having a first end coupled to the collector electrode of said first transistor and a second end coupled to said second source of potential, a control circuit including a second inductor coupled between the base electrode of said first transistor and said first source of potential, said second inductor coupled in energy exchange relationship with said first inductor for applying regenerative feedback energy to said control circuit, a second transistor having base, collector and emitter electrodes with said base electrode coupled to the second end of said first inductor for biasing said second transistor into conduction when said first transistor is conductive, a third inductor, and a diode coupled in a series path with said third inductor, said series path coupled between the emitter and base electrodes of said second transistor, said third inductor being in energy exchange relationship with said first inductor, said third inductor being responsive when a predetermined voltage is applied thereacross to apply reverse base current to said second transistor to reduce the minority carrier storage time of said second transistor.

8. A pulse generator for providing an output signal of substantially constant time duration to a load element which may vary in impedance comprising a first transistor having a control electrode and an emitter-collector circuit, a second transistor having base, emitter and collector electrodes, a first inductor connected in the emitter-collector circuit of said first transistor with a first end connected to the collector of said first transistor and a second end connected to the base of said second transistor, a second inductor connected to said control electrode and in energy exchange relationship with said first inductor, a signal output circuit connected to the emitter and collector electrodes of said second transistor, a third inductor, and a diode connected in series with said third inductor respectively between the base and emitter electrodes of said second transistor, said third inductor being in energy exchange relationship with said first inductor and applying a reverse base current through said diode to said second transistor to thereby reduce the minority carrier storage time of said second transistor.

9. A signal generating circuit responsive to a source of trigger pulses comprising first, second and third sources of potential, a first transistor having base and a load circuit including collector and emitter electrodes, the base electrode of said first transistor coupled to the source of trigger pulses, a first inductor coupled between said base electrode of said first transistor and said first source of potential, a second inductor having a first end coupled to the collector electrode of said first transistor and a second end coupled to said second source of potential, said first and second inductors being in energy exchange relationship to bias said first transistor in response to current flowing through said first inductor so as to develop a pulse during a fixed time, a second transistor having base, collector and emitter electrodes, with said base electrode connected directly to the second end of said second inductor, said emitter and collector electrodes coupled respectively to said second and third sources of potential, said second transistor passing a pulse of current in response to the pulse developed by said first transistor, a third inductor, and a unilateral current conductive device coupled in series with said third inductor between the base and emitter electrodes of said second transistor, said third inductor being in energy exchange relationship with said first and second inductors to control said unilateral current conductive device to provide a reverse base current to said second transistor for reducing the minority storage time thereof at the termination of said pulse of current.

References Cited in the file of this patent

UNITED STATES PATENTS

| | | |
|---|---|---|
| 2,773,220 | Aron | Dec. 4, 1956 |
| 2,777,092 | Mandelkorn | Jan. 8, 1957 |
| 2,780,767 | Janssen | Feb. 5, 1957 |
| 2,791,739 | Light | May 7, 1957 |
| 2,848,613 | Green et al. | Aug. 19, 1958 |
| 2,877,360 | Moore et al. | Mar. 10, 1959 |
| 2,878,440 | Jones, Jr. | Mar. 17, 1959 |